US011923001B2

United States Patent
Lang et al.

(10) Patent No.: US 11,923,001 B2
(45) Date of Patent: Mar. 5, 2024

(54) MANAGING THE PROGRAMMING OF AN OPEN TRANSLATION UNIT

(71) Applicant: Micron Technology, Inc., Boise, ID (US)

(72) Inventors: Murong Lang, San Jose, CA (US); Zhenming Zhou, San Jose, CA (US); Jian Huang, Union City, CA (US); Tingjun Xie, Milpitas, CA (US); Jiangli Zhu, San Jose, CA (US); Nagendra Prasad Ganesh Rao, Folsom, CA (US); Sead Zildzic, Rancho Cordova, CA (US)

(73) Assignee: Micron Technology, Inc., Boise, ID (US)

( * ) Notice: Subject to any disclaimer, the term of this patent is extended or adjusted under 35 U.S.C. 154(b) by 109 days.

(21) Appl. No.: 17/580,178

(22) Filed: Jan. 20, 2022

(65) Prior Publication Data
US 2023/0206997 A1 Jun. 29, 2023

Related U.S. Application Data

(60) Provisional application No. 63/293,233, filed on Dec. 23, 2021.

(51) Int. Cl.
*G11C 11/34* (2006.01)
*G11C 11/56* (2006.01)

(52) U.S. Cl.
CPC ...... *G11C 11/5628* (2013.01); *G11C 11/5671* (2013.01)

(58) Field of Classification Search
CPC .................. G11C 11/5628; G11C 11/5671
See application file for complete search history.

(56) References Cited

U.S. PATENT DOCUMENTS

2020/0090771 A1* 3/2020 Umezawa .......... G11C 16/3459
2021/0082510 A1* 3/2021 Yamada ................ G06F 3/0659

* cited by examiner

*Primary Examiner* — Uyen Smet
(74) *Attorney, Agent, or Firm* — Lowenstein Sandler LLP (57) ABSTRACT

A programming operation is performed on a first set of memory cells addressable by a first wordline (WL), wherein the first set of memory cells are comprised by an open translation unit (TU) of memory cells. It is determined that a second set of memory cells comprised by the open TU are in a coarse programming state, wherein the second set of memory cells is addressable by a second WL. In response to determining that the second set of memory cells satisfies a threshold criterion, a programming state verify level associated with the second WL is reduced by a verify level offset. A programming state gate step size associated with each WL of the open TU is reduced by a predefined value. A programming operation is performed on the second set of memory cells using the reduced programming state verify level and the reduced programming state gate step size.

20 Claims, 6 Drawing Sheets

410 Perform a programming operation on a first set of memory cells addressable by a first WL, wherein the first set of memory cells are comprised by an open TU of memory cells

415 Determine that a second set of memory cells comprised by the open TU are in a coarse programming state, wherein the second set of memory cells is addressable by a second WL

420 In response to determining that the second set of memory cells satisfies a threshold criterion, reduce a programming state verify level associated with the second WL by a verify offset level

425 Reduce a programming state gate step size associated with each WL of the open TU by a predefined value

430 Perform, using the reduced programming state verify level and the reduced programming state gate step size, a programming operation on the second set of memory cells

MANAGING THE PROGRAMMING OF AN OPEN TRANSLATION UNIT

RELATED APPLICATION

This application claims the benefit under 35 U.S.C. § 119(e) to U.S. Provisional Patent Application No. 63/293,233, filed on Dec. 23, 2021, which is herein incorporated by reference in its entirety.

TECHNICAL FIELD

Embodiments of the disclosure relate generally to memory sub-systems, and more specifically, relate to managing the programming of an open translation unit.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to managing the programming of an open translation unit (TU). A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of memory cells arranged in a two-dimensional grid. Memory cells are etched onto a silicon wafer in an array of columns and rows. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

During a programming operation, selected memory cells can be programmed with the application of a programming voltage to a selected wordline. In some cases, an incremental step pulse programming process can be employed to maintain a tight cell threshold voltage distribution for higher data reliability. In the incremental step pulse programming process, a series of high-amplitude pulses of voltage levels having an increasing magnitude (e.g., by a predefined pulse step height) are applied to wordlines to which one or more memory cells are connected to gradually raise the voltage level of the memory cells to above a wordline voltage level corresponding to the programming operation (e.g., a programming level). The application of the uniformly increasing pulses by a wordline driver of the memory device enables the selected wordline to be ramped or increased to a wordline voltage level corresponding to the programming operation. Similarly, a series of voltage pulses having a uniformly increasing voltage level can be applied to the wordline to ramp the wordline to the corresponding wordline voltage level during other memory access operations (e.g., an erase operation).

The series of incrementing voltage programming pulses are applied to the selected wordline to increase a charge level, and thereby a threshold voltage, of each memory cell connected to that wordline. After each programming pulse, or after a number of programming pulses, a program verify operation is performed to determine if the threshold voltage of the one or more memory cells has increased to a desired programming level. For example, the pulses can be incrementally increased in value (e.g., by a programming state gate step size (i.e., voltage value) such as 0.33V) to increase a charge stored on a charge storage structure corresponding to each pulse. The memory device can reach a target programming level voltage for a particular programming level by incrementally storing or increasing amounts of charge corresponding to the programming state gate step size.

According to this approach, the series of programming pulses and program verify operations are applied to program each programming level (e.g., programming levels L1 to L7 for a TLC memory cell) in sequence. For example, this approach sequentially programs the levels of the memory cell (e.g., L1 to L7) by applying a first set of pulses to program level L1 to a first target voltage level, followed by the application of a second set of pulses to program level L2 to a second target voltage level, and so on until all of the levels are programmed.

Some memory sub-systems implement a two-pass programming process to program a set of memory cells addressable by wordline. The first pass is a coarse programming phase, which rapidly programs all memory cells of the wordline to slightly below their final target programming levels. The second pass is a fine programming phase, where the memory cells are programmed in a slower manner to a slightly higher final target programmed voltage. Such two-pass programming minimizes cell to cell (C2C) interference, as every cell and its neighboring cells are nearly at their final target programmed voltage when the fine programming pass is performed, and need only be "touched-up." The combination of not requiring precision programming in the first pass, and the minimized C2C coupling, leads to fast programming with high read window budget (RWB). RWB refers to the space or "valleys" between threshold voltage distributions. The larger the space between the voltage distributions (i.e., the higher the RWB), the more voltage shift can be tolerated.

One phenomenon observed during programming operations is charge loss, in which threshold voltage distributions shift away from an originally-programmed level due to variations in temperature and/or passage of time, making it more difficult to determine a logical state of a memory cell. Charge loss can cause defects in the data retention characteristics of the memory cells. Quick charge loss (QCL) is the quantity of charge loss, measurable in threshold voltage, that is lost from a memory cell soon after having been programmed, e.g., within a second or seconds. QLC is the result of electrons trapped in a tunnel oxide layer after the application of a programming pulse moving back into the channel region of a string of memory cells. When a cell passes the program verify operation, the programmed threshold voltage appears to be higher due to the trapped charge in the tunnel oxide layer. When the memory cell is later read after the programming operation has been completed, however, the cell can have a threshold voltage that is lower than the threshold voltage obtained during the program verify operation due to the charge in the tunnel oxide layer leaking out to the channel region. This can require an enlargement of threshold voltage distributions in order to accommodate all possible threshold voltages for a given state, and can lead to a higher raw bit error rate (i.e., RBER) and read retry rate during subsequent read operations.

A TU is a base granularity of data managed by the memory device. A TU can include a predefined number of logical units (e.g., logical pages, logical blocks, etc.). In some examples, a TU is predefined to include one block. In some examples, a TU is predefined to include multiple blocks. An open TU can include wordlines that are not currently programmed (e.g., in an erase state). Open TUs can remain open for a time period (e.g., several hours) until they are closed (e.g., fully programmed).

Some memory devices can have an open TU that has been programmed up to a certain wordline (e.g., the most recently programmed wordline). Before programming begins for the next open wordline, the next open wordline (also hereinafter referred to as the "next wordline to be programmed" or "next wordline") can be left in a coarse programming phase. Since open TUs can remain open for indefinite time, the next wordline to be programmed can be in a coarse programming phase for a long period of time before programming continues. When programming continues, the next wordline is programmed using the second programming pass, i.e., the fine programming phase. In certain memory devices, leaving the next wordline in a coarse programming state for a certain period of time (e.g., over 2 hours) at a certain temperature (e.g., 70 degrees Celsius) can result in a high RBER and read retry rate for the wordline once programming continues. Since the next wordline remains in a coarse programming phase for the longest time as compared to the remaining wordlines to be programmed, the next wordline experiences a higher threshold voltage Vt distribution shift compared to the remaining wordlines to be programmed after the next wordline.

The next wordline to be programmed is a critical wordline in open TUs because it has better data retention properties in comparison to the remaining wordlines to be programmed. This is due to the wordline being in a coarse programming phase for an extended period of time, during which QCL occurs. After continuing programming on the next wordline and switching to a fine programming phase which increases voltage slightly and in a slower manner, there are less charges being injected into the memory cell(s). As such, the amount of QCL that occurs is minimal as compared to the QCL that occurs during the coarse programming phase, which can result in less RBER and a low read retry rate for subsequent read operations. Thus, it can be desirable to lower the RBER for the next wordline to be programmed in order to maintain the data retention properties of that wordline after it is programmed and improve the overall data integrity of the memory device.

Aspects of the present disclosure address the above and other deficiencies by reducing the verify level and gate step size (i.e., the voltage value corresponding to each increment in value for a programming pulse) when continuing programming of a wordline on an open TU. Reducing the verify level when programming the wordline lowers the threshold voltage for each programming level, while reducing the gate step size tightens the threshold voltage distribution width, thereby reducing the RBER for the wordline. In some embodiments of the present disclosure, a memory sub-system can perform a programming operation on a set of memory cells. The set of memory cells can be connected to a wordline (e.g., the most recently programmed wordline) on an open TU of memory cells. The memory sub-system can detect that another set of memory cells are in a coarse programming state based on the threshold voltage distribution shift for the most recently programmed wordline. The other set of memory cells be connected to another wordline (e.g., an open wordline that is next to be programmed) on the open TU. In some embodiments of the present disclosure, the memory sub-system can determine that the other set of memory cells has a current temperature that is greater than a threshold temperature and/or that the other set of memory cells is in a coarse programming state for greater than a threshold period of time. If the other set of memory cells has a current temperature that is greater than the threshold temperature and/or the other set of memory cells is in a coarse programming state for greater than the threshold period of time, the memory sub-system can reduce the verify level for the other wordline (e.g., the wordline that is next to be programmed) by a configurable value. In some embodiments of the present disclosure, the memory sub-system can reduce the gate step size for the other wordline by a configurable value. In some embodiments of the present disclosure, the memory sub-system can perform a programming operation on the other set of memory cells (i.e., the memory cells connected to the wordline that is next to be programmed). The memory sub-system can perform the programming operation using the reduced verify level and the reduced gate step size.

Advantages of the present disclosure include, but are not limited to, reducing RBER and read retry rates in the first wordline that is programmed when programming continues on an open TU. Once the RBER and read retry rates of the wordline is lowered, the overall data integrity of the memory sub-system can be improved, which can further result in an improvement in performance of the memory sub-system.

Figure 1:
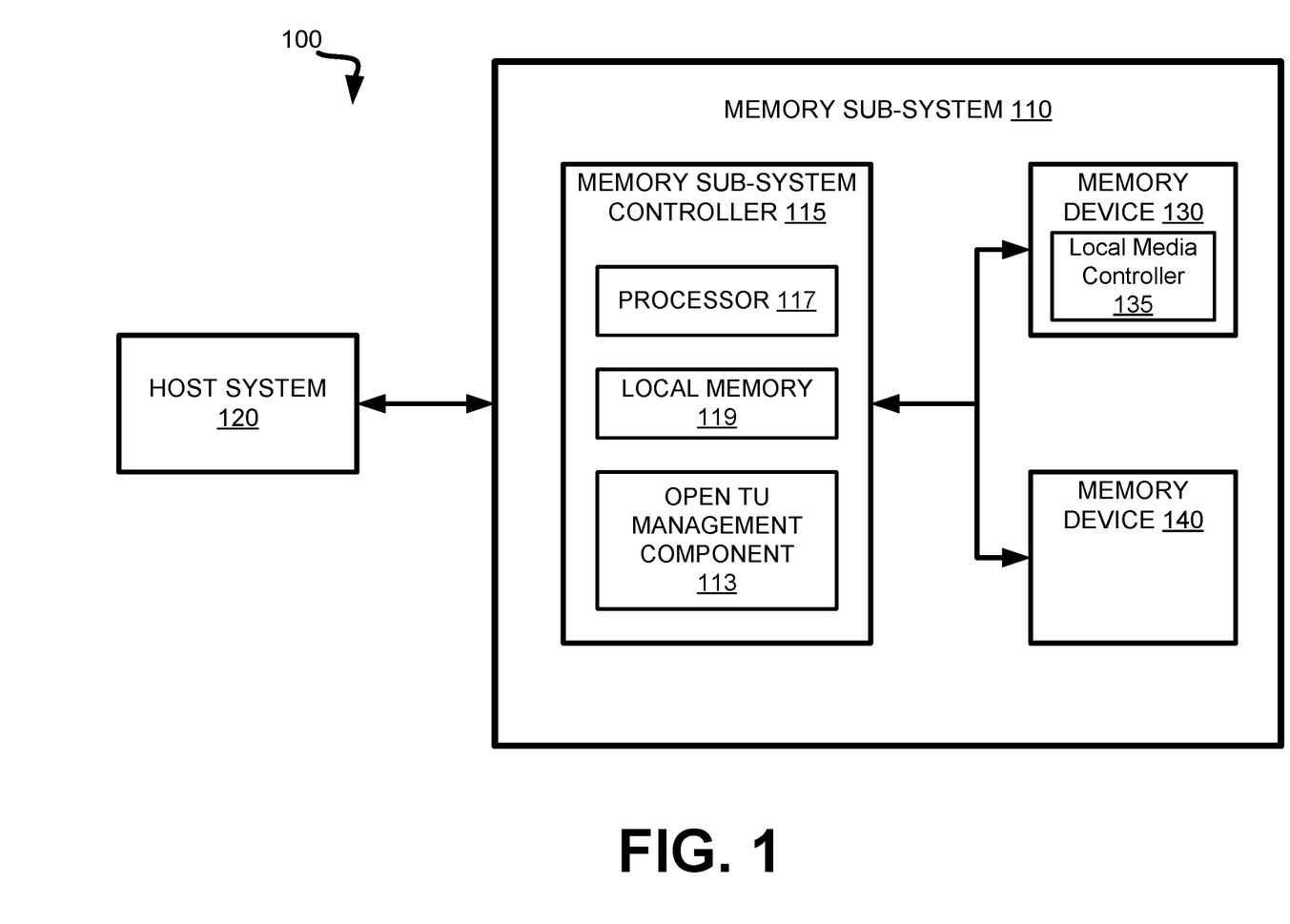
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes an open TU management component 113 that can manage the programming of an open TU by reducing the verify level and gate step size when continuing programming of a wordline. In some embodiments, the memory sub-system controller 115 includes at least a portion of the open TU management component 113. In some embodiments, the open TU management component 113 is part of the host system 110, an application, or an operating system. In other embodiments, local media controller 135 includes at least a portion of the open TU management component 113 and is configured to perform the functionality described herein.

The open TU management component 113 can perform a programming operation on a set of memory cells. The set of memory cells can be connected to a wordline (e.g., a most recently programmed wordline). The set of memory cells can be comprised by an open TU of memory cells. The open TU management component 113 can detect that another set of memory cells are in a coarse programming state. The other set of memory cells be connected to another wordline (e.g., the next open wordline to be programmed). The other set of memory cells can be comprised by the open TU. In some embodiments of the present disclosure, the open TU management component 113 can determine whether the other set of memory cells satisfies a threshold criterion (e.g., the other set of memory cells has a current temperature greater than a threshold temperature and/or the other set of memory cells was in a coarse programming state for greater than a threshold period of time). In response to determining that the other set of memory cells satisfies the threshold criterion, the open TU management component 113 can reduce a programming state verify level for the other wordline by a verify level offset. In some embodiments of the present disclosure, the open TU management component 113 can reduce a programming state gate step size associated with each WL of the open TU by a predefined value. In some embodiments of the present disclosure, the open TU management component 113 can perform, using the reduced programming state verify level and the reduced programming state gate step size, a programming operation on the other set of memory cells. Further details with regards to the operations of the open TU management component 113 are described below.

Figure 2:
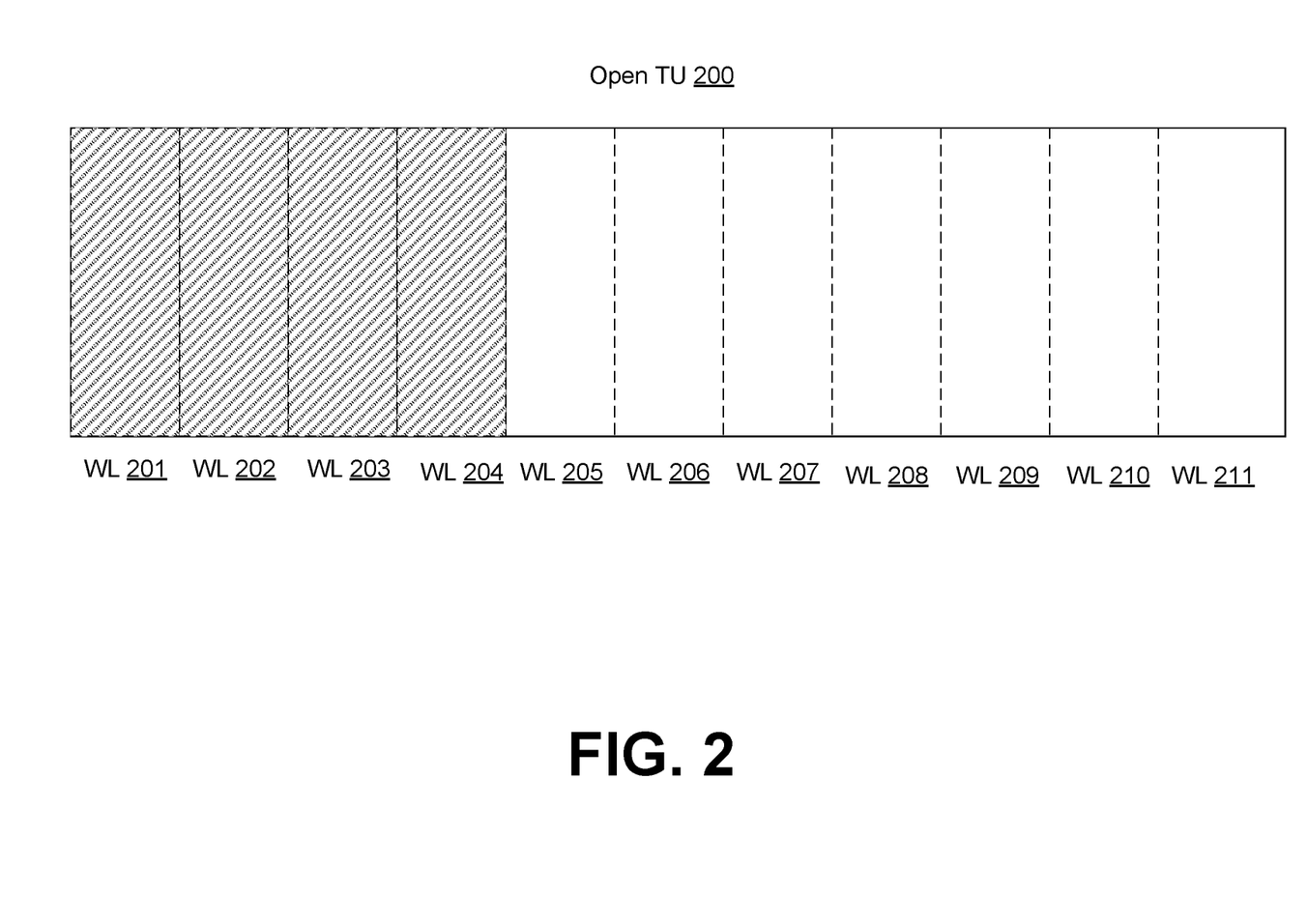
FIG. 2 is a diagram illustrating an example open translation unit in accordance with some embodiments of the present disclosure.

FIG. 2 is a diagram illustrating an example open TU 200, in accordance with some embodiments of the present disclosure. For example, the open TU 200 can be a NAND block. As shown, the open TU 200 includes a set of wordlines (WL), WL 201-WL 211. Each wordline can be a conductive line connected to control gates of a group of memory cells. The set of wordlines, WL 201-WL 211, includes a set of programmed WLs and a set of erased WLs. For example, WL 201 through WL 204 are programmed wordlines, where WL 201 corresponds to the least recently programmed WL, and WL 204 corresponds to the most recently programmed WL. The set of erased WLs include WL 205 through WL 211. WL 205 is the next WL to be programmed once programming on the open TU continues.

Figure 3:
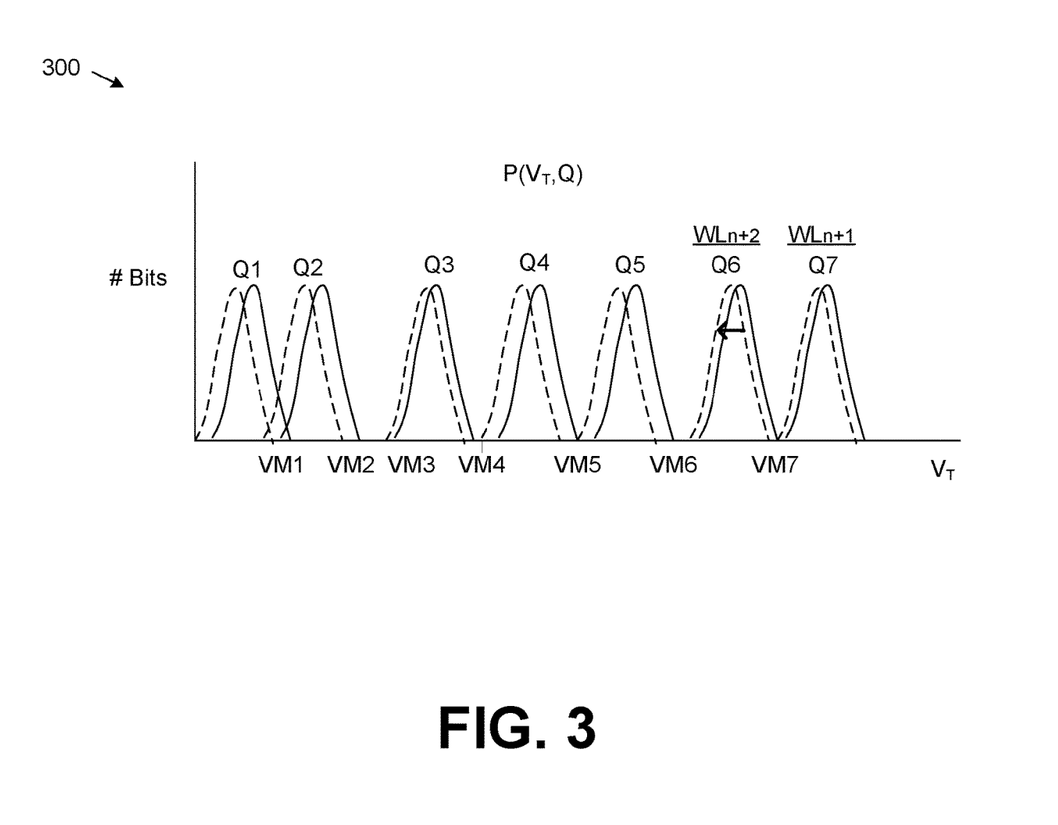
FIG. 3 is a diagram schematically illustrating the shifts in threshold voltage for wordlines of an open translation unit, in accordance with some embodiments of the present disclosure.

FIG. 3 is a diagram schematically illustrating the higher shift in threshold voltage for a wordline (WL) of an open TU (i.e., the first wordline to be programmed when programming continues) in comparison to other WLs yet to be programmed, in accordance with some embodiments of the present disclosure. The threshold voltage distributions $P(V_T, Q_k)$ are separated with 7 valley margins $VM_n$. Q1 through Q7 represent a charge state. Memory cells programmed into a particular charge state $Q_k$ can store a particular combination of bits (e.g., 3 bits). The distributions of threshold voltages depicted in solid lines are distributions for the memory cells on a first wordline to be programmed (e.g., $WL_{n+1}$). With the passage of time and due to changes in temperature, as a result of QCL, the distributions shift up towards higher values of $V_T$. The distributions of threshold voltages depicted in dashed lines are distributions for the memory cells on a wordline that is to be programmed after $WL_{n+1}$ (e.g., $WL_{n+2}$). The memory cells on $WL_{n+2}$ experience a shift in threshold voltage distribution to the left (typically, towards lower values of $V_T$).

Figure 4:
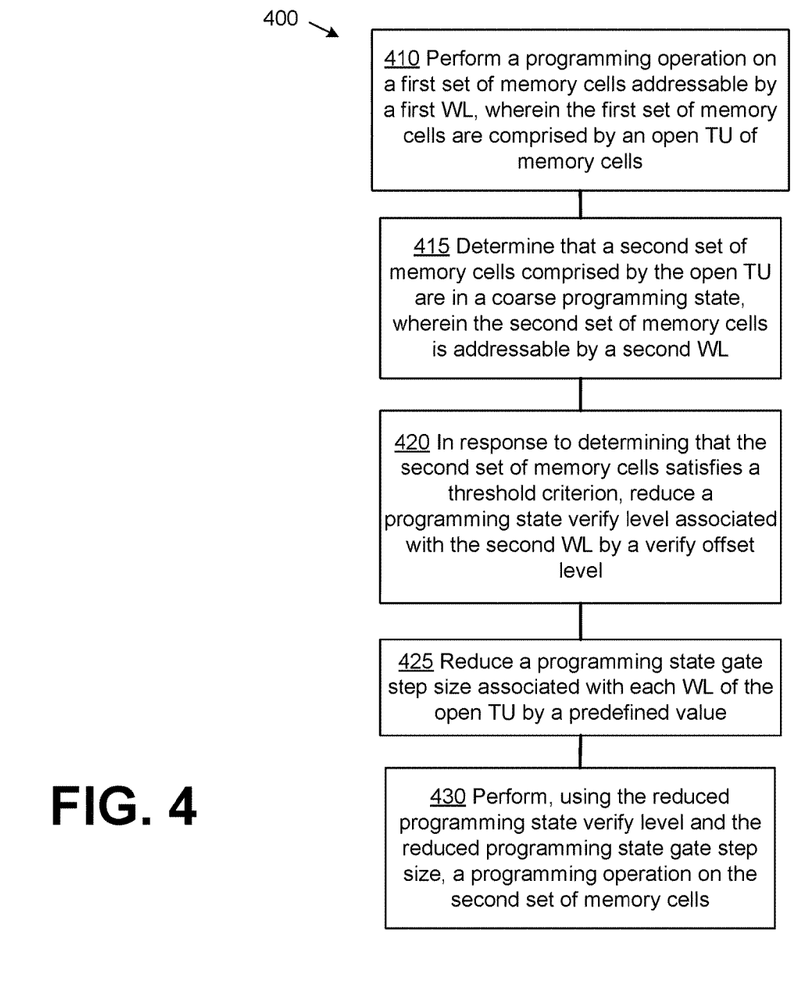
FIG. 4 is a flow diagram of an example method to manage the programming of an open translation unit in accordance with some embodiments of the present disclosure.

FIG. 4 is a flow diagram of an example method 400 to manage the programming of an open TU, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the open TU management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic performs a programming operation on a set of memory cells. For example, the set of memory cells can include a page (e.g., 4 KB page) or a block of the memory device. The set of memory cells can be addressable by a wordline (WL). The set of memory cells can be comprised by an open translation unit (TU). In some embodiments, the WL can be the most recently programmed WL of the open TU. In some embodiments, performing the programming operation includes performing a programming operation in a fine programming phase.

At operation 415, the processing logic determines that another set of memory cells are in a coarse programming state. The other set of memory cells can be comprised by the open TU. The other set of memory cells can be addressable by another WL. In some embodiments, the processing logic identifies the other set of memory cells by identifying the set of memory cells addressable by a WL that resides logically adjacent to the WL described at operation 410. In some embodiments, the other WL is the next WL to be programmed once programming continues in the open TU. The processing logic can identify the next WL to be programmed by identifying the WL that resides logically adjacent to the WL described at operation 410 (e.g., the WL that is the most recently programmed WL of the open TU). In some embodiments, the processing logic can determine that the other set of memory cells are in a coarse programming state by identifying a threshold voltage distribution shift for the WL described at operation 410. In some embodiments, the processing logic can identify the threshold voltage distribution shift for the WL based on a read operation to be performed on the set of memory cells addressable by the WL described at operation 410. The threshold voltage distribution shift can be a shift in threshold voltage for the WL due to an amount of charge loss (e.g., quick charge loss) that has occurred on the WL. In some embodiments, the processing logic can determine that the other set of memory cells are in a coarse programming state by identifying the threshold voltage distribution shift for the WL described at operation 410. The processing logic can identify the threshold voltage distribution shift for the WL by detecting a number of bits below the coarse programming state level. In some embodiments, the coarse programming state level can be set and/or updated in a trim table. The trim table can be a data structure stored on the memory device. In some embodiments, the processing logic can determine that the other set of memory cells are in a coarse programming state by recording a time stamp for a most recently programmed set of memory cells comprised by the TU (e.g., the set of memory cells addressable by the most recently programmed WL as described herein above). The processing logic can record the time stamp using a timer device associated with the memory device. The processing logic can further record a current time stamp for the open TU. The current time stamp for the open TU can be recorded using a timer device associated with the memory device. The processing logic can determine a difference between the recorded time stamp and the current time stamp by calculating a difference in value between the recorded time stamp and the current time stamp. The processing logic can identify a current temperature for the open TU. The current temperature for the open TU can be identified using a temperature sensor and/or temperature measuring device associated with the memory device. The processing logic can determine that the current temperature for the open TU and the difference between the recorded time stamp and the current time stamp satisfy a threshold criterion. Satisfying the threshold criterion can include determining that the current temperature and the difference between the recorded time stamp and the current time stamp is greater than the threshold criterion. In some embodiments, the threshold criterion can be preconfigured based on offline testing and characterization of the memory device.

At operation 420, the processing logic reduces a programming state verify level for the other WL (e.g., the next WL to be programmed on the open TU as described herein above) by a verify level offset. Reducing the programming state verify level by the verify level offset can include lowering the threshold voltage for the other WL by a voltage value (i.e., the verify level offset). In some embodiments, the value of the verify level offset can be scaled based on the threshold voltage for each WL of the open TU. In some embodiments, each level of WLs of the open TU can have a different verify level offset. In some embodiments, the verify level offset can be scaled proportionally to the threshold voltage for each level. For example, levels with WLs with lower threshold voltages will have a smaller verify level offset in comparison to levels with WLs with higher threshold voltages, which will have a higher verify level offset. In some embodiments, the verify level offset is the same for each level of the open TU. In some embodiments, the processing logic reduces the programming state verify level in response to determining that the other set of memory cells satisfy a threshold criterion. Satisfying the threshold criterion can include determining that the other set of memory cells (e.g., the set of memory cells addressable the wordline that is next to be programmed on the open TU as described herein above) satisfies a threshold temperature and/or a threshold time. In some embodiments, determining that the other set of memory cells satisfies the threshold temperature can include identifying that a current temperature of the other set of memory cells while in the coarse programming state is greater than the threshold temperature. The current temperature of the other set of memory cells can be identified using one or more temperature sensors and/or temperature measuring devices associated with the memory device. In some embodiments, the threshold temperature can be 70 degrees Celsius. In some embodiments, the threshold temperature can be preconfigured based on offline testing and characterization of the memory device. In some embodiments, determining that the other set of memory cells satisfies the threshold time can include identifying that a current time stamp of the other set of memory cells is greater than the threshold time. The current time stamp of the other set of memory cells can be identified based on a timer device associated with the memory device. In some embodiments, the threshold time can be 2 hours. In some embodiments, the threshold time can be preconfigured based on offline testing and characterization of the memory device. In some embodiments, the processing logic can determine that the other set of memory cells does not satisfy the threshold criterion (e.g., threshold time and/or threshold temperature). In response to determining that the other set of memory cells does not satisfy the threshold criterion, the processing logic can perform a programming operation on the other set of memory cells. In some embodiments, the processing logic performs the programming operation on the other set of memory cells without reducing the programming state verify level and the programming state gate step size for the other WL. For example, the processing logic can use the default programming state verify level and the programming state gate step size for the other WL. In some embodiments, performing the programming operation includes performing a programming operation in a fine programming phase.

At operation 425, the processing logic reduces a programming state gate step size for the open TU. Reducing the programming state gate step size can include reducing the programming gate step size for each programming level of the open TU. In some embodiments, the processing logic reduces the programming state gate step size by a predefined value (e.g., 0.2V). In some embodiments, the processing logic reduces the programming state gate step size for a level of the open TU in response to determining that the threshold voltage for the level satisfies a threshold criterion. In some embodiments, determining that the threshold voltage for the level satisfies the threshold criterion can include determining that the threshold voltage is greater than the threshold criterion. In some embodiments, the threshold criterion can be preconfigured based on offline testing and characterization of the memory device. For example, the processing logic can reduce the programming state gate step size for each level that has a higher threshold voltage than the threshold criterion. In some embodiments, the processing logic can determine that the threshold voltage for the level does not satisfy the threshold criterion. In response to determining that the threshold voltage for the level does not satisfy the threshold criterion, the processing logic does not reduce the programming state gate step size for the level.

At operation 430, the processing logic performs a programming operation on the other set of memory cells. In some embodiments, the processing logic performs the programming operation using the reduced programming state verify level and the reduced programming state gate step size. In some embodiments, performing the programming operation includes performing a programming operation in a fine programming phase. In some embodiments, the processing logic identifies a third set of memory cells. The third set of memory cells can be addressable by a third WL and can be comprised by the open TU. The third set of memory cells can be adjacent to the other set of memory cells described at operation 415. In some embodiments, the processing logic can perform a programming operation on the third set of memory cells. In some embodiments, the processing logic performs the programming operation using a programming state verify level and programming state gate step size associated with the third WL. In some embodiments, performing the programming operation includes performing a programming operation in a fine programming phase.

Figure 5:
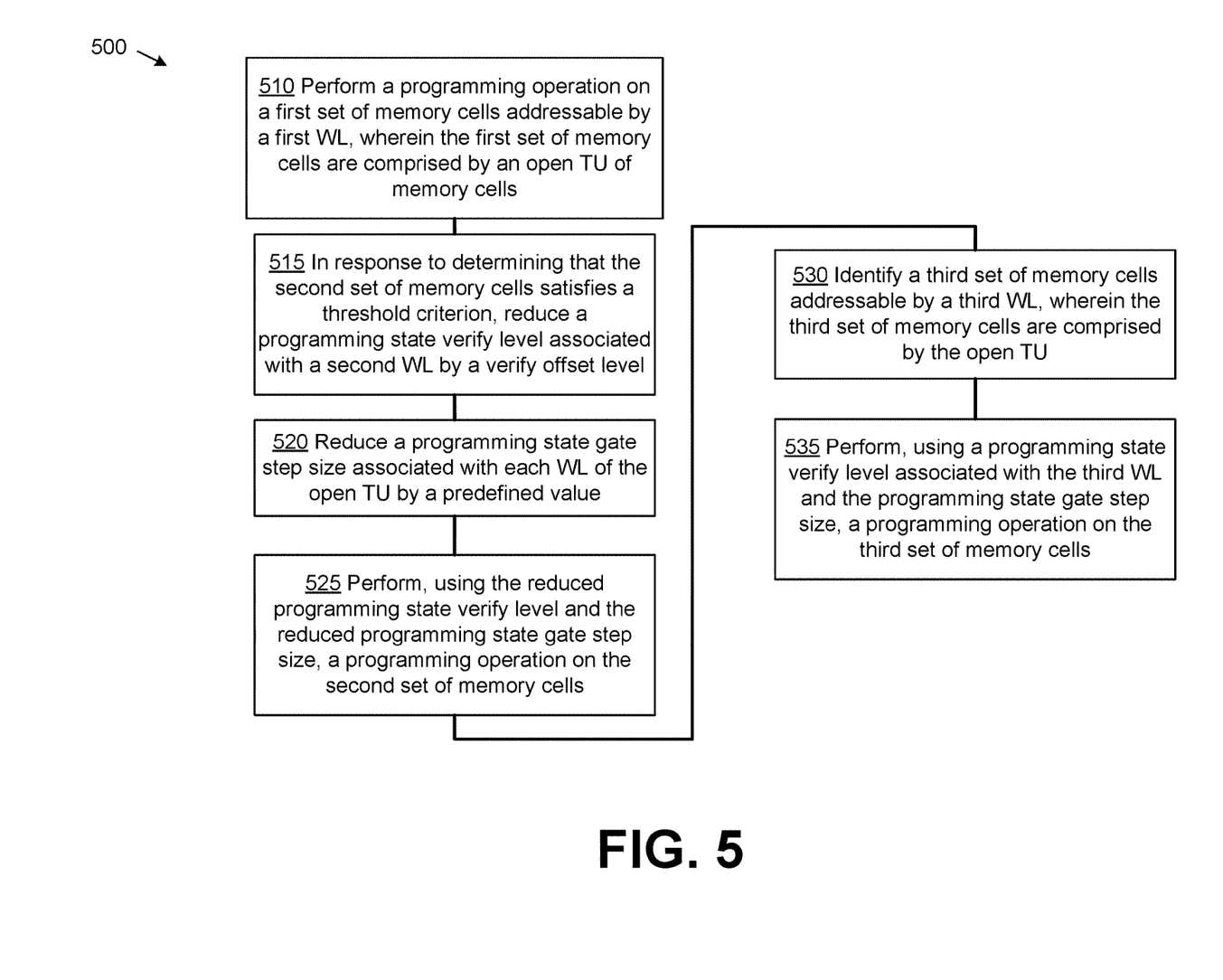
FIG. 5 is flow diagram of an example method to manage the programming of an open translation unit in accordance with some embodiments of the present disclosure.

FIG. 5 is a flow diagram of an example method 500 to manage the programming of an open TU, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the open TU management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic performs a programming operation on a set of memory cells. For example, the set of memory cells can include a page (e.g., 4 KB page) or a block of the memory device. The set of memory cells can be addressable by a wordline (WL). The set of memory cells can be comprised by an open translation unit (TU). In some embodiments, the WL can be the most recently programmed WL of the open TU. In some embodiments, performing the programming operation includes performing a programming operation in a fine programming phase.

At operation 515, the processing logic reduces a programming state verify level for another WL (e.g., the next WL to be programmed on the open TU) by a verify level offset. The other WL can address another set of memory cells that are comprised by the open TU. In some embodiments, the processing logic identifies the other set of memory cells by identifying the set of memory cells addressable by a WL that resides logically adjacent to the WL described at operation 510. In some embodiments, the other WL is the next WL to be programmed once programming continues in the open TU. The processing logic can identify the next WL to be programmed by identifying the WL that resides logically adjacent to the WL described at operation 510 (e.g., the WL that is the most recently programmed WL of the open TU). In some embodiments, reducing the programming state verify level by the verify level offset can include lowering the threshold voltage for the other WL by a voltage value (i.e., the verify level offset). In some embodiments, the value of the verify level offset can be scaled based on the threshold voltage for each WL of the open TU. In some embodiments, each level of WLs of the open TU can have a different verify level offset. In some embodiments, the verify level offset can be scaled proportionally to the threshold voltage for each level. For example, levels with WLs with lower threshold voltages will have a smaller verify level offset in comparison to levels with WLs with higher threshold voltages, which will have a higher verify level offset. In some embodiments, the verify level offset is the same for each level of the open TU. In some embodiments, the processing logic reduces the programming state verify level in response to determining that the other set of memory cells satisfy a threshold criterion. Satisfying the threshold criterion can include determining that the other set of memory cells (e.g., the set of memory cells addressable by the wordline that is next to be programmed on the open TU as described herein above) satisfies a threshold temperature and/or a threshold time. In some embodiments, determining that the other set of memory cells satisfies the threshold temperature can include identifying that a current temperature of the other set of memory cells while in the coarse programming state is greater than the threshold temperature. The current temperature of the other set of memory cells can be identified using one or more temperature sensors and/or temperature measuring devices associated with the memory device. In some embodiments, the threshold temperature can be 70 degrees Celsius. In some embodiments, the threshold temperature can be preconfigured based on offline testing and characterization of the memory device. In some embodiments, determining that the other set of memory cells satisfies the threshold time can include identifying that a current time stamp of the other set of memory cells is greater than the threshold time. The current time stamp of the other set of memory cells can be identified based on a timer device associated with the memory device. In some embodiments, the threshold time can be 2 hours. In some embodiments, the threshold time can be preconfigured based on offline testing and characterization of the memory device. In some embodiments, the processing logic can determine that the other set of memory cells does not satisfy the threshold criterion (e.g., threshold time and/or threshold temperature). In response to determining that the other set of memory cells does not satisfy the threshold criterion, the processing logic can perform a programming operation on the other set of memory cells. In some embodiments, the processing logic performs the programming operation on the other set of memory cells without reducing the programming state verify level and the programming state gate step size for the other WL. For example, the processing logic can use the default programming state verify level and the programming state gate step size for the other WL. In some embodiments, performing the programming operation includes performing a programming operation in a fine programming phase.

Further at operation 515, the processing logic can determine that the other set of memory cells are in a coarse programming state by identifying a threshold voltage distribution shift for the WL described at operation 510. In some embodiments, the processing logic can identify the threshold voltage distribution shift for the WL based on a read operation to be performed on the set of memory cells addressable by the WL described at operation 510. The threshold voltage distribution shift can be a shift in threshold voltage for the WL due to an amount of charge loss (e.g., quick charge loss) that has occurred on the WL. In some embodiments, the processing logic can determine that the other set of memory cells are in a coarse programming state by identifying the threshold voltage distribution shift for the WL described at operation 510 based on a trim operation to be performed on the set of memory cells addressable by the WL. In some embodiments, the processing logic can determine that the other set of memory cells are in a coarse programming state by recording a time stamp for a most recently programmed set of memory cells comprised by the TU (e.g., the set of memory cells addressable by the most recently programmed wordline as described herein above). The processing logic can record the time stamp using a timer device associated with the memory device. The processing logic can further record a current time stamp for the open TU. The current time stamp for the open TU can be recorded using a timer device associated with the memory device. The processing logic can determine a difference between the recorded time stamp and the current time stamp by calculating a difference in value between the recorded time stamp and the current time stamp. The processing logic can identify a current temperature for the open TU. The current temperature for the open TU can be identified using a temperature sensor and/or temperature measuring device associated with the memory device. The processing logic can determine that the current temperature for the open TU and the difference between the recorded time stamp and the current time stamp satisfy a threshold criterion. Satisfying the threshold criterion can include determining that the current temperature and the difference between the recorded time stamp and the current time stamp is greater than the threshold criterion. In some embodiments, the threshold criterion can be preconfigured based on offline testing and characterization of the memory device.

At operation 520, the processing logic reduces a programming state gate step size for the open TU. Reducing the programming state gate step size can include reducing the programming gate step size for each level of WLs of the open TU. In some embodiments, the processing logic reduces the programming state gate step size by a predefined value (e.g., 0.1V). In some embodiments, the processing logic reduces the programming state gate step size for a level of the open TU in response to determining that the threshold voltage for the level satisfies a threshold criterion. In some embodiments, determining that the threshold voltage for the level satisfies the threshold criterion can include determining that the threshold voltage is greater than the threshold criterion. In some embodiments, the threshold criterion can be preconfigured based on offline testing and characterization of the memory device. For example, the processing logic can reduce the programming state gate step size for each level that has a higher threshold voltage than the threshold criterion. In some embodiments, the processing logic can determine that the threshold voltage for the level does not satisfy the threshold criterion. In response to determining that the threshold voltage for the level does not satisfy the threshold criterion, the processing logic does not reduce the programming state gate step size for the level.

At operation 525, the processing logic performs a programming operation on the other set of memory cells. In some embodiments, the processing logic performs the programming operation using the reduced programming state verify level and the reduced programming state gate step size. In some embodiments, performing the programming operation includes performing a programming operation in a fine programming phase.

At operation 530, the processing logic identifies a third set of memory cells. The third set of memory cells can be addressable by a third WL and can be comprised by the open TU. The third set of memory cells can be adjacent to the other set of memory cells described at operation 515.

At operation 535, the processing logic can perform a programming operation on the third set of memory cells. In some embodiments, the processing logic performs the programming operation using a programming state verify level and programming state gate step size associated with the third WL. In some embodiments, performing the programming operation includes performing a programming operation in a fine programming phase.

Figure 6:
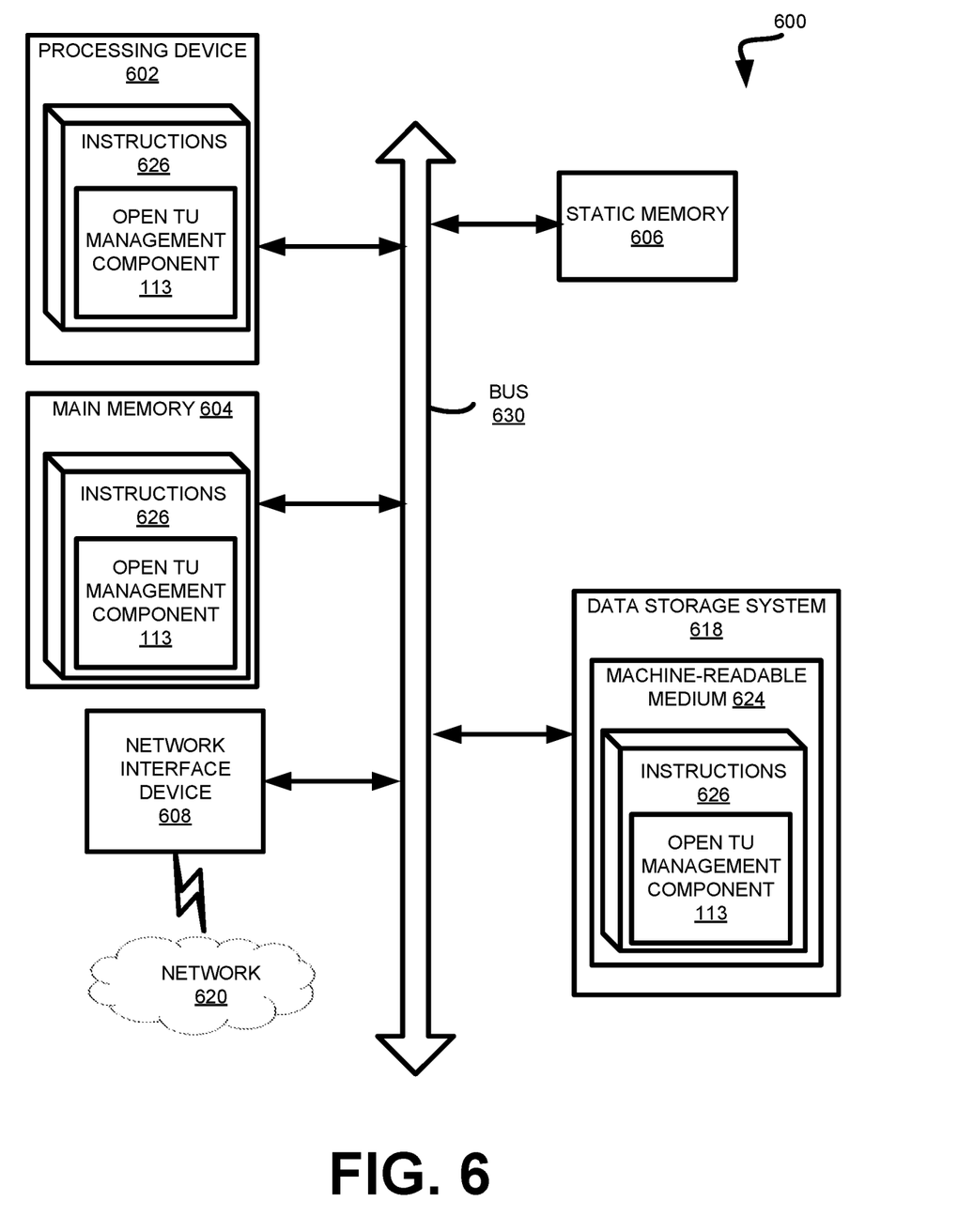
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the open TU management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to an open TU management component (e.g., the open TU management component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory device; and
   a processing device, operatively coupled with the memory device, to perform operations comprising:
      performing a programming operation on a first set of memory cells addressable by a first wordline (WL), wherein the first set of memory cells is comprised by an open translation unit (TU) of memory cells;
      determining a difference between a recorded time stamp for a most recently programmed set of memory cells comprised by the open TU and a current time stamp for the open TU;
      determining that a current temperature for the open TU and the difference between the recorded time stamp and the current time stamp satisfy a threshold criterion, wherein satisfying the threshold criterion is indicative of a second set of memory cells comprised by the open TU being in a coarse programming state, wherein the second set of memory cells is addressable by a second WL;
      reducing a programming state verify level associated with the second WL by a verify level offset;
      reducing a programming state gate step size associated with each WL of the open TU by a predefined value; and
      performing, using the reduced programming state verify level and the reduced programming state gate step size, a programming operation on the second set of memory cells.

2. The system of claim 1, wherein the processing device is to perform operations further comprising:
   identifying a third set of memory cells addressable by a third WL, wherein the third set of memory cells is comprised by the open TU; and
   performing, using a programming state verify level associated with the third WL and a programming state gate step size associated with each WL of the open TU, a programming operation on the third set of memory cells.

3. The system of claim 1, wherein the processing device is to perform operations further comprising:
   in response to determining that the current temperature for the open TU and the difference between the recorded time stamp and the current time stamp do not satisfy the threshold criterion, performing, using a programming state verify level associated with the second WL and a programming state gate step size associated with each WL of the open TU, the programming operation on the second set of memory cells.

4. The system of claim 1, wherein the processing device is to perform operations further comprising:
   determining that the second set of memory cells comprised by the open TU is in the coarse programming state; and
   identifying a threshold voltage distribution shift for the first WL based on a read operation to be performed on the first set of memory cells addressable by the first WL.

5. The system of claim 1, wherein the processing device is to perform operations further comprising:
   determining that the second set of memory cells comprised by the open TU is in the coarse programming state; and
   identifying a threshold voltage distribution shift for the first WL based on a trim operation to be performed on the first set of memory cells addressable by the first WL.

6. The system of claim 1, wherein the processing device is to perform operations further comprising:
   determining that the second set of memory cells comprised by the open TU is in the coarse programming state;
   recording the time stamp for the most recently programmed set of memory cells comprised by the open TU;
   recording the current time stamp for the open TU; and
   identifying the current temperature for the open TU.

7. The system of claim 1, wherein the verify level offset is scaled based on an amount of threshold voltage for each WL of the open TU.

8. The system of claim 1, wherein the second WL resides logically adjacent to the first WL.

9. A method comprising:
   performing a programming operation on a first set of memory cells addressable by a first wordline (WL), wherein the first set of memory cells is comprised by an open translation unit (TU) of memory cells;
   determining a difference between a recorded time stamp for a most recently programmed set of memory cells comprised by the open TU and a current time stamp for the open TU;
   determining that a current temperature for the open TU and the difference between the recorded time stamp and the current time stamp satisfy a threshold criterion, wherein satisfying the threshold criterion is indicative of a second set of memory cells comprised by the open TU being in a coarse programming state, wherein the second set of memory cells is addressable by a second WL;

reducing a programming state verify level associated with the second WL by a verify level offset;

reducing a programming state gate step size associated with each WL of the open TU by a predefined value; and performing, using the reduced programming state verify level and the reduced programming state gate step size, a programming operation on the second set of memory cells.

10. The method of claim 9, further comprising:

identifying a third set of memory cells addressable by a third WL, wherein the third set of memory cells is comprised by the open TU; and performing, using a programming state verify level associated with the third WL and a programming state gate step size associated with each WL of the open TU, a programming operation on the third set of memory cells.

11. The method of claim 9, further comprising:

in response to determining that the current temperature for the open TU and the difference between the recorded time stamp and the current time stamp do not satisfy the threshold criterion, performing, using a programming state verify level associated with the second WL and a programming state gate step size associated with each WL of the open TU, the programming operation on the second set of memory cells.

12. The method of claim 9, further comprising:

determining that the second set of memory cells comprised by the open TU is in the coarse programming state; and identifying a threshold voltage distribution shift for the first WL based on a read operation to be performed on the first set of memory cells addressable by the first WL.

13. The method of claim 9, further comprising:

determining that the second set of memory cells comprised by the open TU is in the coarse programming state; and identifying a threshold voltage distribution shift for the first WL based on a trim operation to be performed on the first set of memory cells addressable by the first WL.

14. The method of claim 9, further comprising:

determining that the second set of memory cells comprised by the open TU is in the coarse programming state;

recording the time stamp for the most recently programmed set of memory cells comprised by the open TU;

recording the current time stamp for the open TU; and identifying the current temperature for the open TU.

15. The method of claim 9, wherein the verify level offset is scaled based on an amount of threshold voltage for each WL of the open TU.

16. A non-transitory computer-readable storage medium comprising instructions that, when executed by a processing device, cause the processing device to perform operations comprising:

performing a programming operation on a first set of memory cells addressable by a first wordline (WL), wherein the first set of memory cells is comprised by an open translation unit (TU) of memory cells;

determining a difference between a recorded time stamp for a most recently programmed set of memory cells comprised by the open TU and a current time stamp for the open TU;

determining that a current temperature for the open TU and the difference between the recorded time stamp and the current time stamp satisfy a threshold criterion, wherein satisfying the threshold criterion is indicative of a second set of memory cells comprised by the open TU being in a coarse programming state, wherein the second set of memory cells is addressable by a second WL;

reducing a programming state verify level associated with the second WL by a verify level offset;

reducing a programming state gate step size associated with each WL of the open TU by a predefined value;

performing, using the reduced programming state verify level and the reduced programming state gate step size, a programming operation on the second set of memory cells;

identifying a third set of memory cells addressable by a third WL, wherein the third set of memory cells is comprised by the open TU; and performing, using a programming state verify level associated with the third WL and a programming state gate step size, a programming operation on the third set of memory cells.

17. The non-transitory computer-readable storage medium of claim 16, wherein the processing device is to perform operations further comprising:

determining that the second set of memory cells is in the coarse programming state.

18. The non-transitory computer-readable storage medium of claim 16, wherein the processing device is to perform operations further comprising:

in response to determining that the current temperature for the open TU and the difference between the recorded time stamp and the current time stamp do not satisfy the threshold criterion, performing, using a programming state verify level associated with the second WL and a programming state gate step size, the programming operation on the second set of memory cells.

19. The non-transitory computer-readable storage medium of claim 16, wherein the processing device is to perform operations further comprising:

determining that the second set of memory cells comprised by the open TU is in the coarse programming state; and identifying a threshold voltage distribution shift for the first WL based on a read operation to be performed on the first set of memory cells addressable by the first WL.

20. The non-transitory computer-readable storage medium of claim 16, wherein the processing device is to perform operations further comprising:

determine that the second set of memory cells comprised by the open TU is in the coarse programming state; and identifying a threshold voltage distribution shift for the first WL based on a trim operation to be performed on the first set of memory cells addressable by the first WL.

* * * * *